United States Patent [19]
Yamaji et al.

[11] Patent Number: 6,057,723
[45] Date of Patent: *May 2, 2000

[54] PHASE SHIFTER

[75] Inventors: Takafumi Yamaji, Yokohama; Hiroshi Tanimoto, Kawasaki, both of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/006,044

[22] Filed: Jan. 12, 1998

[30] Foreign Application Priority Data

Jan. 13, 1997 [JP] Japan ................................. 9-003949

[51] Int. Cl.$^7$ ......................................................... H03H 3/00
[52] U.S. Cl. ............................ 327/237; 231/552; 231/557
[58] Field of Search ..................................... 327/557, 558, 327/559, 232, 237, 254, 255, 257, 258, 231, 552; 333/164, 139; 324/77

[56] References Cited

U.S. PATENT DOCUMENTS 4,459,542  7/1984  Terrier et al. ............................. 324/77
5,519,349  5/1996  Nakahara ................................. 327/559

OTHER PUBLICATIONS

Johnson et al. "A Handbook of Active Filters", pp. 110–113, 1980.

Primary Examiner—Dinh T. Le
Attorney, Agent, or Firm—Oblon, Spivak, McClelland, Maier & Neustadt, P.C.

[57] ABSTRACT

By disposing the first filter circuit and the second filter circuit whose connection structures are the same and whose element values are different on an integrated circuit, a phase shifter with output signals whose frequency characteristics and errors of phase shift characteristics equally vary can be accomplished.

1 Claim, 15 Drawing Sheets

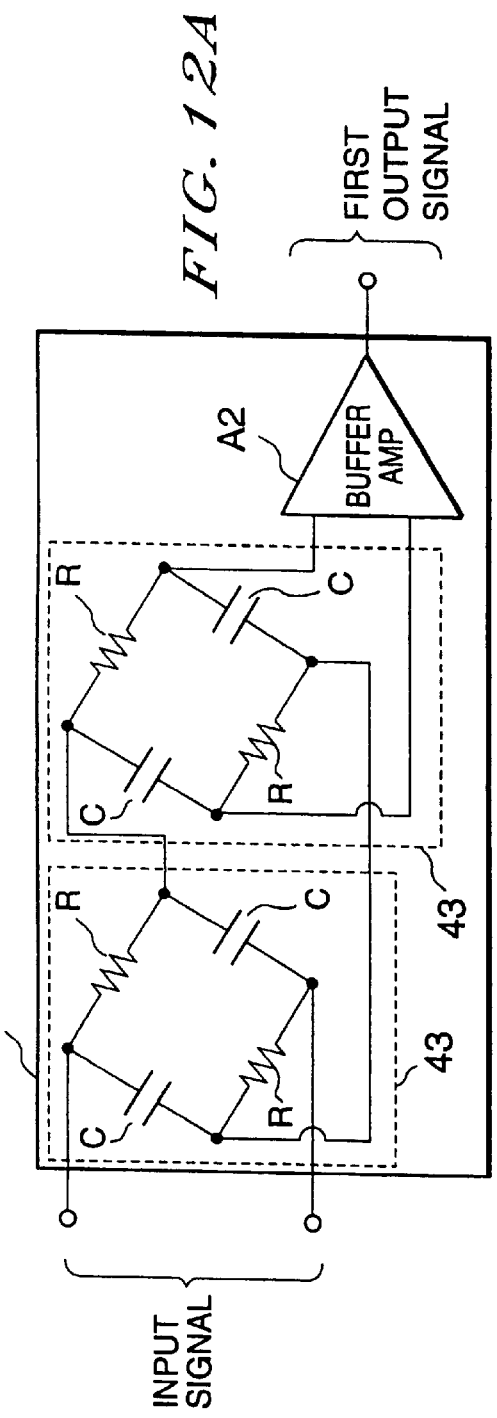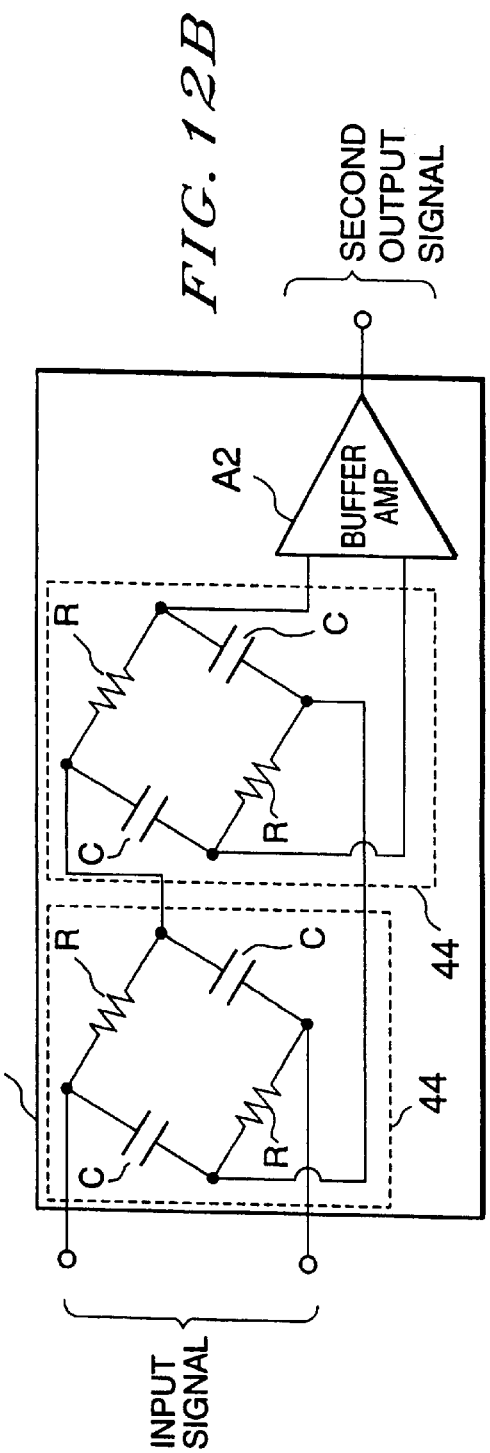

PHASE SHIFTER

BACKGROUND OF THE INVENTION

1. Field of the Invention

The present invention relates to a phase shifter for use with a receiving unit for receiving a radio frequency signal such as a radio communication signal and for demodulating the received signal.

2. Description of the Related Art

A radio receiving unit such as a portable telephone set has a quadrature demodulating circuit and an image eliminating frequency converter. In the quadrature demodulator and the image eliminating frequency converter, a multiplying circuit and a phase shifter are used as major structural elements.

Hiroyuki Kikuchi et. al. has disclosed a phase shifter in "GHz-Band Monolithic Modem IC's", IEEE TRANSACTION ON MICROWAVE THEORY AND TECHNIQUES, VOL. MTT-35, NO. 12 DECEMBER 1987 (FIG. 5).

In this phase shifter, the phase is adjusted with an external control voltage. This phase shifter was provided to prevent a fabrication error that takes place in a phase shifter formed on an integrated circuit.

Kazuya Yamamoto et. al. has disclosed a phase shifter in "A 1.9-GHz-Band GaAs Direct-Quadrature Modulator IC with a Phase Shifter", IEEE JOURNAL OF SOLID-STATE CIRCUITS, VOL 28, NO. 10, OCTOBER 1993, PP 994–1000 (FIG. 6).

This phase shifter has a first filter circuit and a second filter circuit. The first filter circuit has a differential circuit with resistor elements and capacitor elements for a high pass characteristic. The second filter circuit has an integrating circuit with resistor elements and capacitor elements for a low pass characteristic. Thus, the phase sifter output two signals whose phases deviate from each other by 90°. In this circuit, when the relative accuracies of these elements are high, two output signals with small phase errors can be obtained.

However, in a portable telephone set, the phase shifter is used as a part of the RF stage. Thus, the phase shifter should be structured as one chip (namely, the phase shifter should be composed of an IC chip).

However, since the absolute accuracies of the elements on the IC chip cannot be improved, if the element structures of the individual filter circuits are changed as with the phase shifter of Kazuya Yamamoto et. al, it is difficult to match the amplitudes of two signals obtained from these filter circuits.

On the other hand, Jan Crols has disclosed a phase shifter in "A Single Chip 900 MHZ COMS Receiver Front-end with a High Performance Low-IF Topology", IEEE JOURNAL OF SOLID-STATE CIRCUITS, VOL. 30, NO. 12, DECEMBER 1995, PP 1483–1492 (FIG. 6). In this phase shifter, many resistor elements and many capacitor elements are used so as to reduce errors of phases and errors of amplitudes.

However, in this case, output signals should have phases that deviate by 90° to the phase of the input signals.

Thus, output signals with phases that deviate from the phase of an input signal by for 45° cannot be obtained.

A phase shifter that generates output signals with phases that deviate by 45° has been disclosed in U.S. Pat. No. 4,612,518. This phase shifter is used for a vector modulating circuit with a ⅛ λ transmission line and a harmonic mixer.

In this case, since a group delay on the transmission line does not depend on a frequency for use, the phase shift amount can be varied in proportion to the frequency. However, to vary the phase shift amount, the length of the transmission line should be varied. Thus, the length of the transmission line should be long in radio frequencies such as microwave and GHz band used for portable telephone sets, radio units, and so forth. Consequently, such a transmission line cannot be physically formed on an IC chip.

SUMMARY OF THE INVENTION

The present invention is made from the above-described point of view.

A first object of the present invention is to accomplish a general-purpose high-performance phase shifter.

A second object of the present invention is to structure a phase shifter with a high absolute accuracy.

A third object of the present invention is to accomplish a receiving unit that is small and that has a high performance.

To accomplish the above-described objects, the present invention is a phase shifter, comprising a first filter circuit, disposed on an integrated circuit and composed of a plurality of elements, for outputting a first signal that has a different phase from an input signal and that has a predetermined frequency band of the input signal and a second filter circuit, disposed on the integrated circuit and composed of a plurality of elements having the same structure as the first filter circuit and having different element values therefrom, for outputting a second signal that has a different phase from the input signal and that has a predetermined frequency band of the input signal.

Examples of the first filter circuit and the second filter circuit are all pass filters, band elimination filters, and so forth.

In other words, in the phase shifter according to the present invention, the first filter circuit and the second filter circuit of which the connection structures thereof are the same and part of the element values thereof are different are disposed on an integrated circuit.

Generally, on an integrated circuit, when the resistance of a resistor with a designed value of 1 kΩ becomes 1.1 kΩ due to an error, the resistance of a resistor with a designed value of 2 kΩ becomes around 2.2 kΩ.

Thus, in the first filter circuit with a designed value of 45° as a phase difference between an input signal (at 10 MHz) and an output signal, the frequency of the output signal and the phase difference between the input and output signals become 11 MHz and 45°, respectively. On the other hand, in the second filter circuit with a designed value of 45° as a phase difference between an input signal (at 20 MHz) and an output signal, the frequency of the output signal and the phase difference between the input and output signals become 22 MHz and 45°, respectively.

According to the present invention, since the first filter circuit and the second filter circuit whose connection structures are the same and part of the element values thereof are different are disposed on an integrated circuit, a phase shifter with output signals whose frequency characteristics and errors of phase shift characteristics equally vary can be accomplished.

Thus, even if element values of the integrated circuit deviate, the characteristics of the two filter circuits equally are shifted or displaced in the same direction on logarithmic frequency axis. Moreover, in the vicinity of the frequency of the input signal, when frequency characteristics are selected so that the two filter circuits become band pass filters, two signals whose amplitudes are nearly the same can be obtained.

On the other hand, an RC bridge circuit is known as a 90° phase-shifting circuit. However, an RC bridge circuit can be treated as a all pass filter. With a combination of RC bridge circuits with different element values, a phase shifter with a low element sensitivity can be disposed on an integrated circuit.

When a plurality of RC bridge circuits are tandem-connected, the fluctuation of the phase due to the fluctuation of element values can be further decreased.

Thus, with the first filter circuit and the second filter circuit disposed on an integrated circuit, a general-purpose high-performance phase shifter can be accomplished. In addition, since the first filter circuit and the second filter circuit are disposed on an integrated circuit, a phase shifter with a high absolute accuracy. Moreover, when the phase shifter according to the present invention is used for a radio signal processing stage, a receiving unit that is small and that has a high performance can be accomplished.

These and other objects, features and advantages of the present invention will become more apparent in light of the following detailed description of a best mode embodiment thereof, as illustrated in the accompanying drawings.

BRIEF DESCRIPTION OF THE DRAWINGS

FIG. 12 is a schematic diagram showing the structure of a signal distribution phase shifter according to a third embodiment of the present invention;

DESCRIPTION OF PREFERRED EMBODIMENTS

Next, with reference to the accompanying drawings, embodiments of the present invention will be described.

Figure 1:
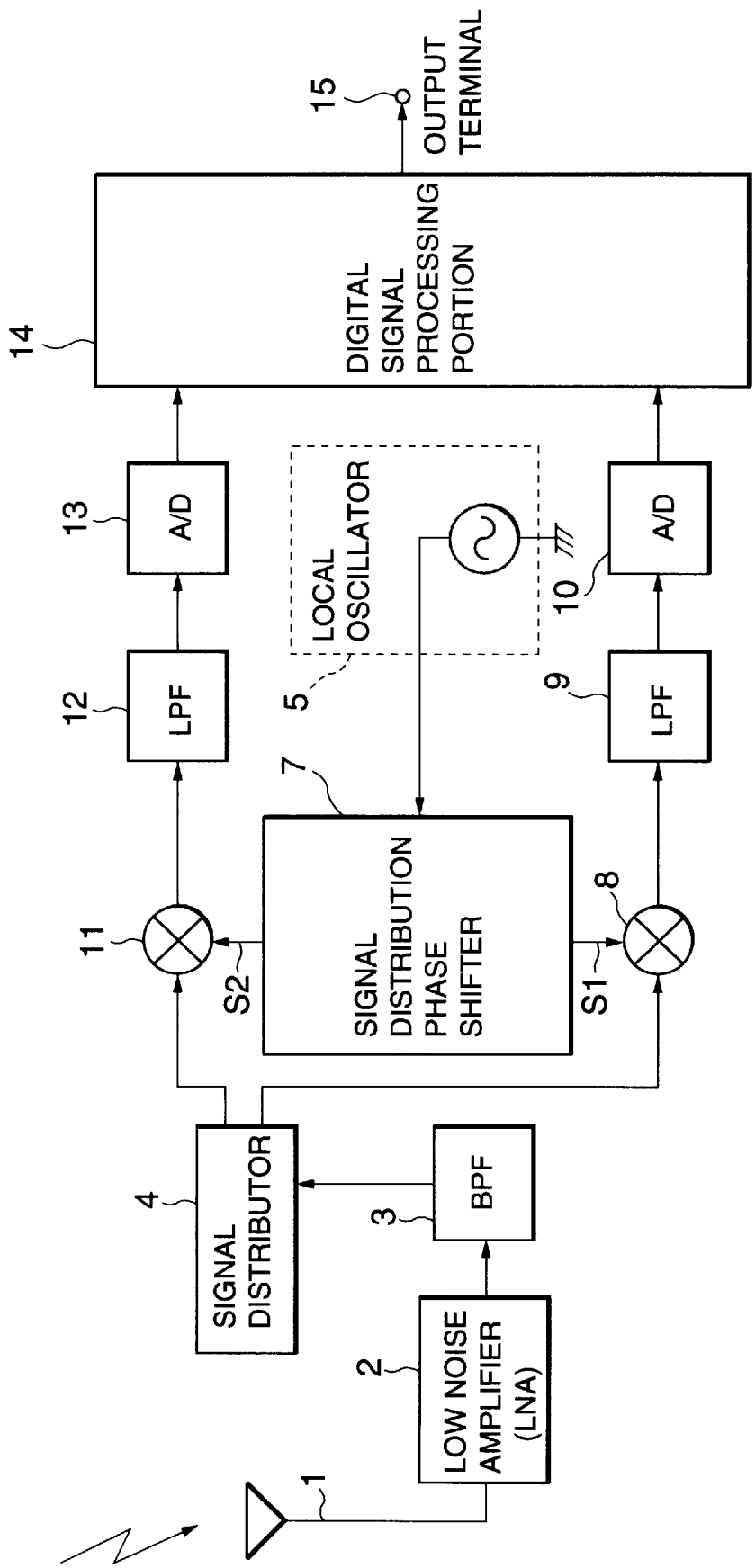
FIG. 1 is a block diagram showing the structure of a radio receiver (receiving unit) having a phase shifter according to a first embodiment of the present invention.
Figure 2:
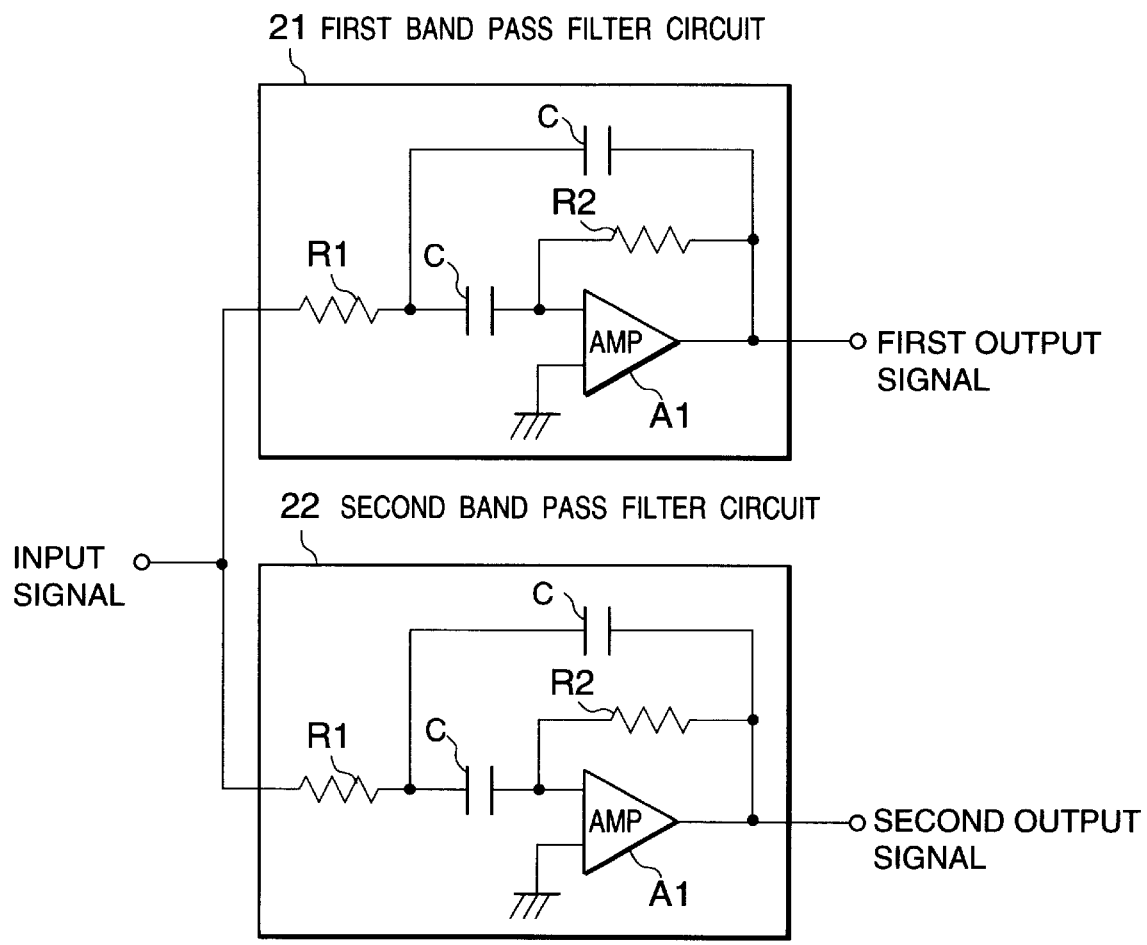
FIG. 2 is a schematic diagram showing a signal distribution phase shifter of the radio receiving unit shown in FIG. 1.

FIG. 1 is a schematic diagram showing the structure of a radio receiver (receiving unit) having a phase shifter according to a first embodiment of the present invention. FIG. 2 is a schematic diagram showing the signal distribution phase shifter of the radio receiver shown in FIG. 1.

In FIG. 1, the radio receiver comprises an antenna 1, a low noise amplifier 2 (hereinafter, referred to as LNA 2), a band pass filter 3 (hereinafter, referred to as BPF 3), a signal distributor 4, a local oscillator 5, a signal distributor phase shifter 7, a multiplying unit 8, a low pass filter 9 (referred to as LPF 9), an A/D converter 10, a multiplying unit 11, an LPF 12, an A/D converter 13, a digital signal processing portion 14, and a terminal 15. The antenna 1receives a radio frequency signal (RF signal). The LNA 2 amplifies the received radio frequency signal with a low noise. The BPF 3 limits the frequency band of the amplified output signal of the LNA 2. The signal distributor 4 distributes the filtered signal. The local oscillator 5 generates a local oscillation signal with the frequency corresponding to the RF signal. The signal distribution phase shifter 7 inputs the local oscillation signal with nearly the same frequency of the RF signal and generates a first output signal S1 and a second output signal S2 with phases that are different from the phase of the input signal. The multiplying unit 8 multiplies the first output signal S1 of the signal distribution phase shifter 7 by the RF signal distributed by the signal distributor 4. The LPF 9 passes a low frequency component of the output signal of the multiplying unit 8. The A/D converter 10converts an analog output signal of the LPF 9 into a digital signal. The multiplying unit 11 multiplies the second output signal S2 of the signal distribution phase shifter 7 by the RF signal distributed by the signal distributor 4. The LPF 12 passes a low frequency component of the output signal of the multiplying unit 11. The A/D converter 13 converts an analog output signal of the LPF 12 into a digital signal. The digital signal processing portion 14 processes the digital output signals of the A/D converters 10 and 13. The terminal 15 outputs the output signal of the digital signal processing portion 14 to a downstream circuit.

As shown in FIG. 2, the signal distribution phase shifter 7 is composed of a plurality of elements (resistor elements R1 and R2, a capacitor element C, and an operational amplifier (AMP) A1) as a first band pass filter circuit 21 and a second band pass filter circuit 22. The first band pass filter circuit 21 shifts the phase of the input signal. The second band pass filter circuit 22 shifts the phase of the input signal. The structure of the first band pass filter circuit 21 is the same as the structure of the second band pass filter circuit 22. The first band pass filter circuit 21and the second band pass filter 22 are formed as a part of the radio frequency signal processing stage (RF stage) on an IC chip.

In this case, the connection structure of the elements of the band pass filter circuit 21 is the same as the connection structure of the elements of the band pass filter circuit 22. The difference between the first band pass filter circuit 21 and the second band pass filter 22 is in that the element value of the capacitor element C in the first band pass filter circuit 21 differ from that in the second band pass filter circuit 22.

Each of the band pass filter circuits 21 and 22 has a particular band pass characteristic to the frequency of the input signal and a phase shift characteristic. Alternatively, the values of the resistor elements R1 and R2 may be varied instead of the element values of the capacitor elements C.

Next, the operation of the receiving unit will be described.

In the case of this receiving unit, when an RF signal is received from the antenna 1, the RF signal is amplified with a low noise by the LNA 2. Thereafter, the amplified signal with a low noise is supplied to the signal distributor 4 through the BPF 3. The RF signal is divided into two signals for a quadrature-demodulating process.

On the other hand, the local oscillator 5 generates a local oscillation signal (Lo signal). The local oscillation signal is attenuated by a variable attenuator. Thus, a signal with the frequency similar to the RF signal is supplied as an input signal to the signal distribution phase shifter 7. The signal distribution phase shifter 7 generates a first output signal S1 and a second output signal S2 with phases that are shifted from the phase of the input signal.

The signal distribution phase shifter 7 outputs the first signal S1 and the second signal S2 to the first band pass filter circuit 21 and the second band pass filter 22, respectively. The first band pass filter 21 and the second band pass filter 22 shift the phases of the input signals corresponding to the element values of the circuit elements and output the first signal S1 and the second signal S2, respectively.

When an input signal with a frequency of 10 MHz is divided into two signals with a phase difference of for example 45° the element values of the first band pass filter circuit 21 are R1=5 kΩ, R2=10 kΩ, and C=1.74 pF and the element values of the second band pass filter circuit 22 are R1=5 kΩ, R2 =10 kΩ, and C=3.10 pF.

Figure 3:
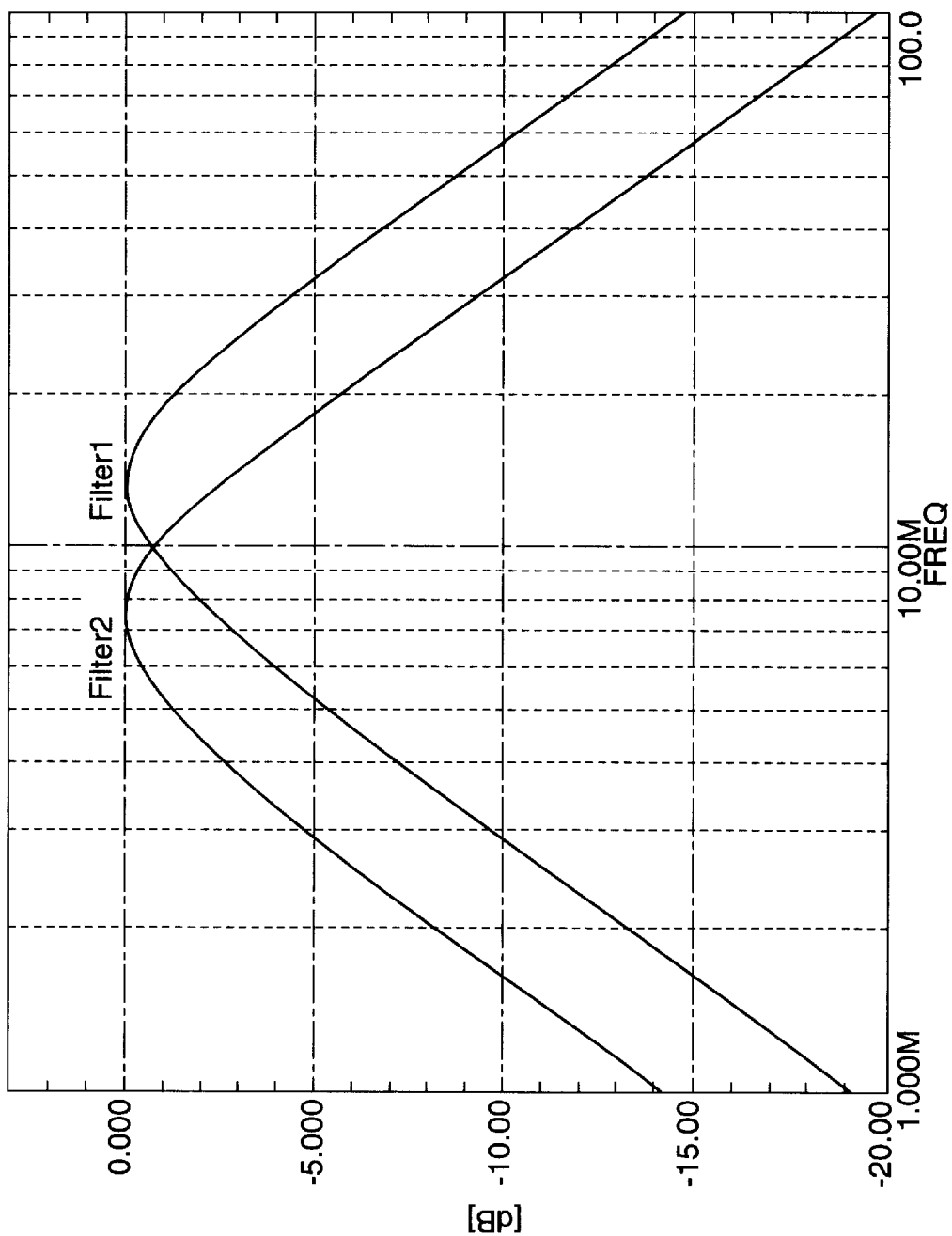
FIG. 3 is a graph showing frequency-amplitude characteristics of the signal distribution phase shifter shown in FIG. 2.

FIG. 3 shows frequency-amplitude characteristics of the first band pass filter circuit 21 and the second band pass filter circuit 22. Referring to FIG. 3, it is clear that the curve of the first band pass filter 21 crosses the curve of the second band pass filter 22 at the center frequency (10 MHz) and that the output amplitude of the first band pass filter 21 is equal to that of the second band pass filter 22 at the center frequency.

Figure 4:
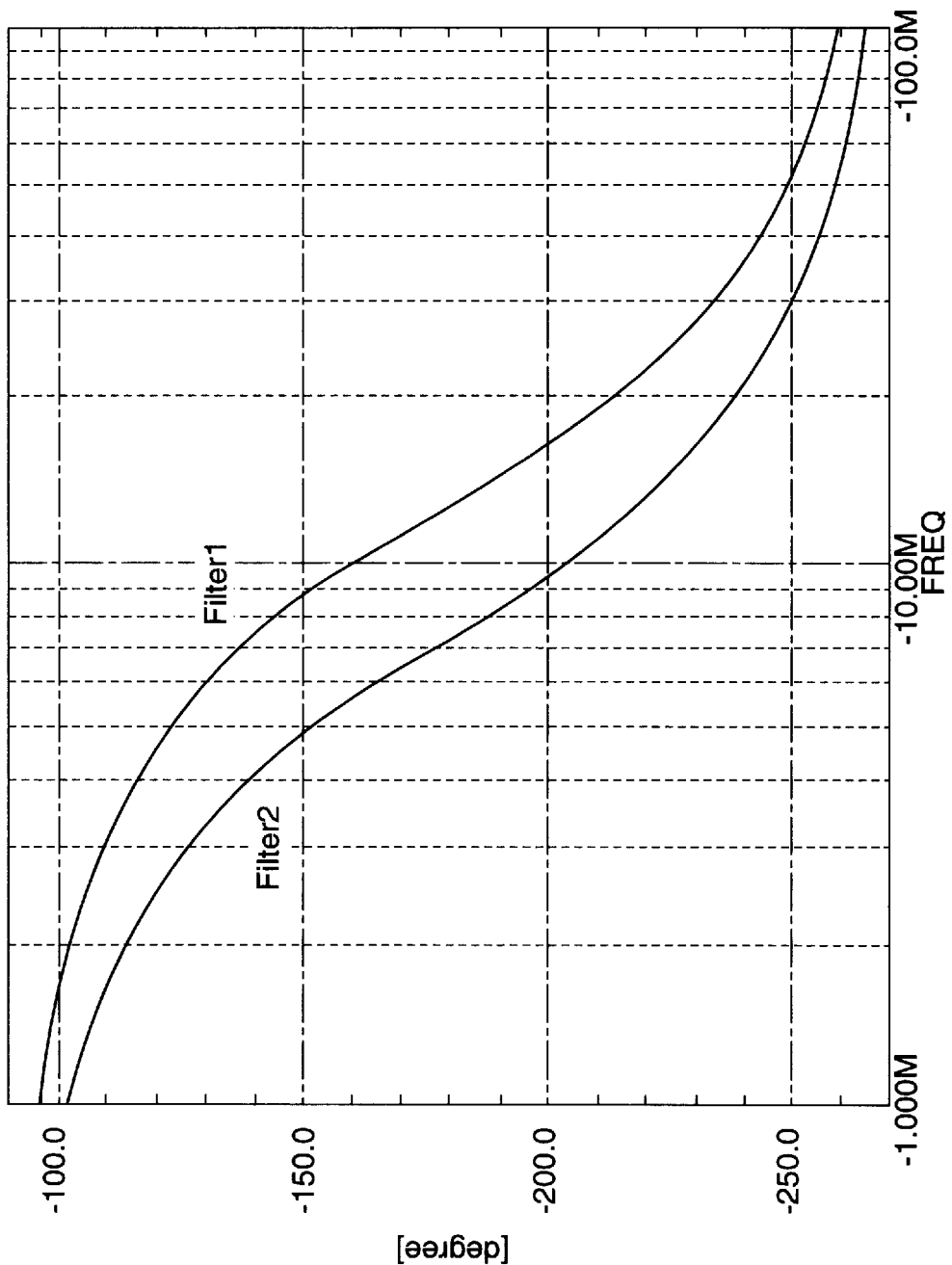
FIG. 4 is a graph showing frequency-phase characteristics of the signal distribution phase shifter shown in FIG. 2.

FIG. 4 shows frequency-phase characteristics of the first filter circuit 21 and the second filter circuit 22. Referring to FIG. 4, it is clear that the slope of the phase characteristic of the first filter circuit 21 is almost the same as that of the second filter circuit 22 at a frequency of around 10 MHz. At this point, the slope of the frequency characteristics of the phase difference is 0.

Figure 5:
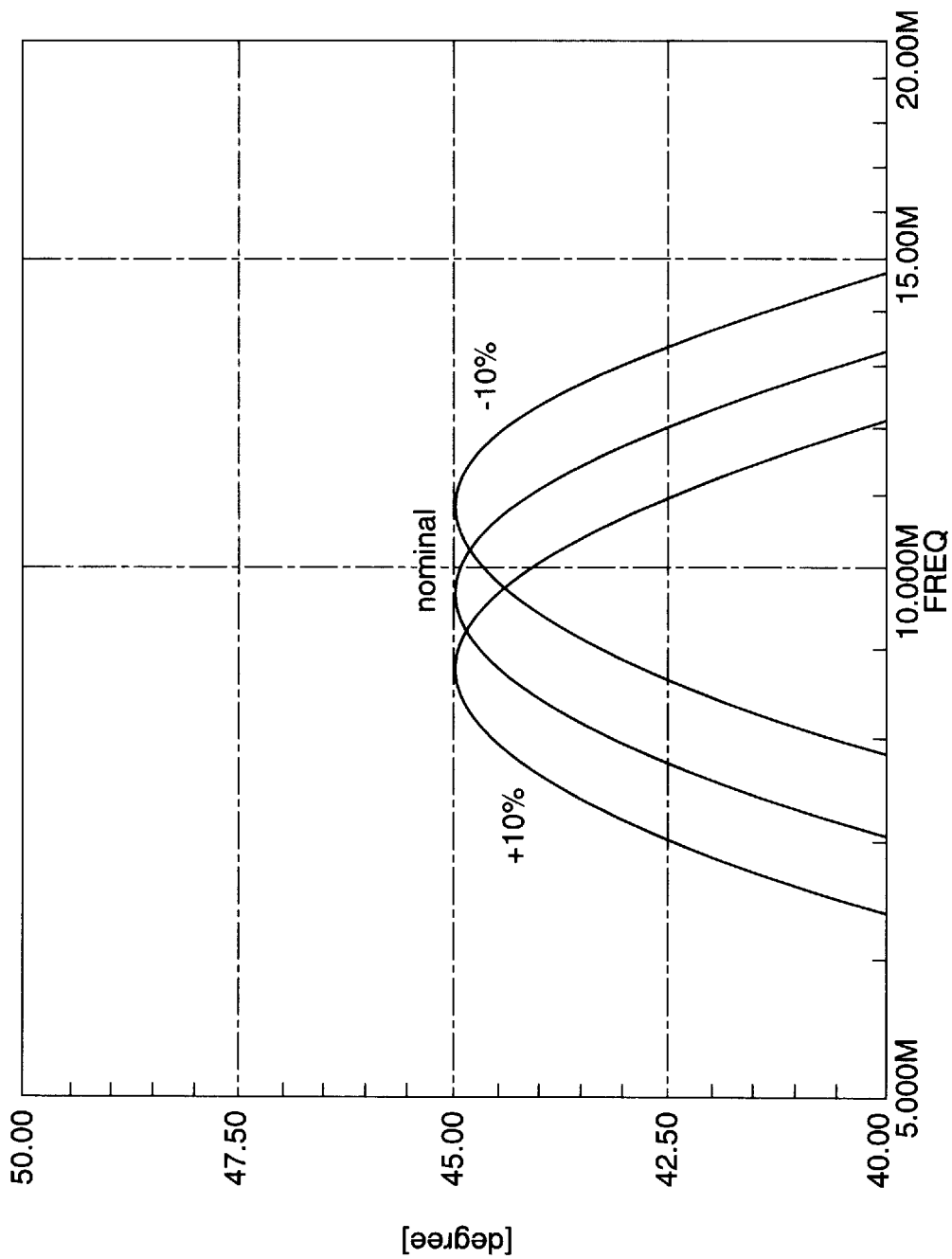
FIG. 5 is a graph showing frequency-phase difference characteristics of the signal distribution phase shifter shown in FIG. 2.

FIG. 5 shows frequency-phase difference characteristics of the first band pass filter 21 and the second band pass filter 22.

In FIG. 5, "nominal" represents a frequency characteristic at the designed center value. In addition, FIG. 5 shows frequency characteristics of which the resistance of the first band pass filter 21 and the resistance of the second band pass filter 22 are increased and decreased by 10%. From FIG. 5, it is clear that even if the resistance of the first band pass filter 2 0and the resistance of the second band pass filter 21 are increased and decreased by around 10%, the phase difference is kept in the range from 44 to 45°.

The first signal S1 and the second signal S2 generated by the signal distribution phase shifter 7 are supplied to the multiplying units 8 and 11. The multiplying units 8 and 11 multiply the first signal S1 and the second signal S2 by the RF signal distributed by the signal distributor 4. The resultant signals are supplied to the LPFs 9 and 12. The LPFs 9 and 12 allow only low frequency components of the respective input signals to pass. The resultant signals are supplied to the A/D converters 10 and 13, respectively. The A/D converters 10 and 13 convert analog signals as output signals of the LPFs 9 and 12 into respective digital signals. The digital signals are supplied to the digital signal processing portion 14. The digital signal processing portion 14 processes the received digital signals and outputs the resultant signals to the output terminal 15.

Next, with reference to FIG. 6, a modification of the signal distribution phase shifter 7 will be described.

In this case, a signal distribution phase shifter 7 is composed of two first band pass filter circuits 21 and two second band pass filter circuits 22. In this case, the two first band pass filter circuits 21 are connected in series. The two second band pass filter circuits 22 are connected in series.

Assuming that the values of the circuit elements of the signal distribution phase shifter 7 is the same as those shown in FIG. 2, the phases of first and second output signals of the signal distribution phase shifter 7 are shifted from the phase of the input signal by 90°.

Assuming that the element values of the two first band pass filter circuits 21 are R1=5 kΩ, R2=10 kΩ, and C=1.94 pF and that the element values of the two second band pass filter circuits 22 are R1=5 kΩ, R2=10 kΩ, and C=2.57 pF, the phases of the first and second output signals are shifted from the phase of the input signal by 45°.

Figure 7:
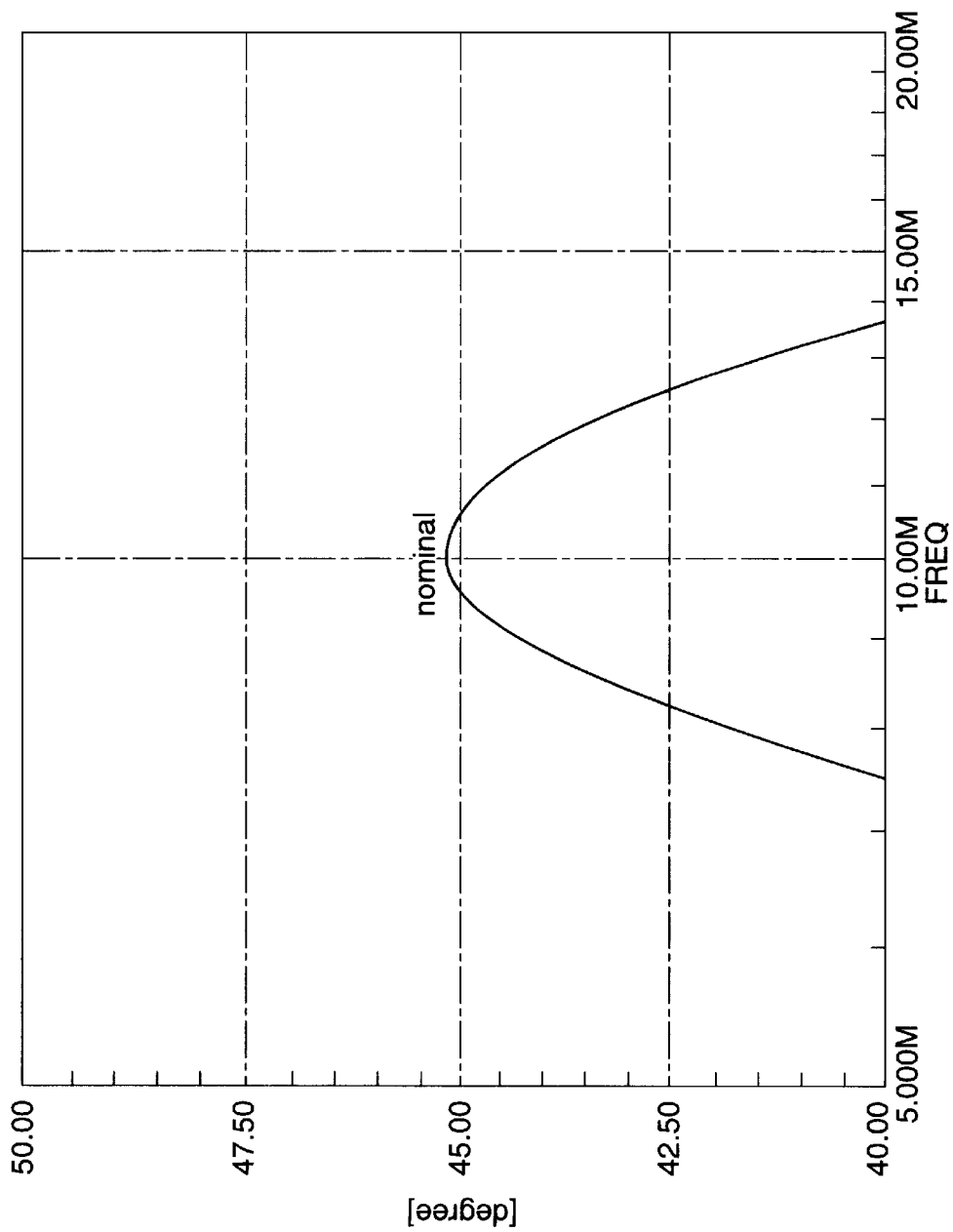
FIG. 7 is a graph showing frequency-phase difference characteristics of the signal distribution phase shifter shown in FIG. 6.

FIG. 7 shows frequency-phase difference characters of the first band pass filters 21 and the second band pass filters 22 in the case that the phase difference is 45°. As with the frequency-phase difference characteristics shown in FIG. 5, the curve of the characteristics shown in FIG. 7 is flat at around 45°.

Figure 8:
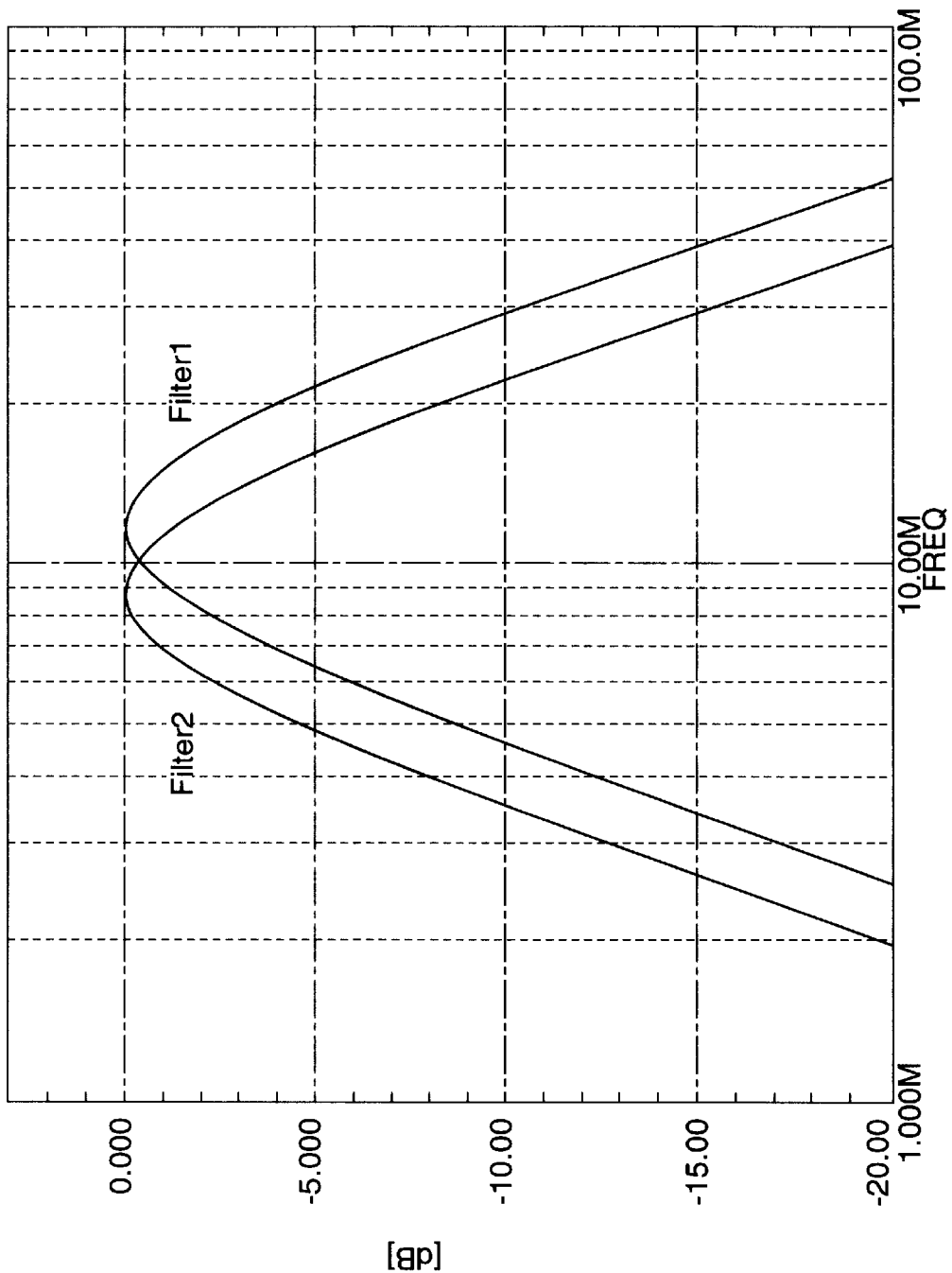
FIG. 8 is a graph showing frequency-amplitude characteristics of the signal distribution phase shifter shown in FIG. 6.

FIG. 8 shows frequency-amplitude characteristics of amplitudes of output signals of the signal distribution phase shifter 7. When, the characteristics shown in FIG. 8 are compared-with the characteristics shown in FIG. 3 (the example of structure shown in FIG. 2), the center frequencies of the frequency bands of the first band pass filter circuits 21 and the second band pass filter circuits 22 in the characteristics shown in FIG. 3 are closer than those shown in FIG. 8. Thus, since the fluctuation at around 100 MHz is small, the accuracy of the signal distribution phase shifter 7 can be improved.

In the receiving unit according to the first embodiment, since the signal distribution phase shifter 7 composed of the first band pass filter 21 and the second band pass filter 22 that have the same element connection structure and different element values is disposed on an IC chip, the influence of the fabrication errors of the circuit elements is suppressed. Even if the resistance increases or decreases by for example 10%, since the phase difference is kept in the range from 44 to 45°, the frequency characteristics of the two output signals of the signal distribution phase shifter 7 are improved. Since the signal distribution phase shifter 7 with high frequency characteristics are disposed on an IC chip, the size and weight of a radio communication unit can be reduced.

In addition, the present invention can be applied to a receiving unit that generates signals with a phase difference of for example 45° or 60° other than 90° to the input signal as with a radio unit using a higher harmonic mixer. Thus, the present invention can be applied to a case of which various phase differences are obtained. Consequently, according to the present invention, a general-purpose phase shifter disposed on an IC chip can be accomplished.

Figure 6:
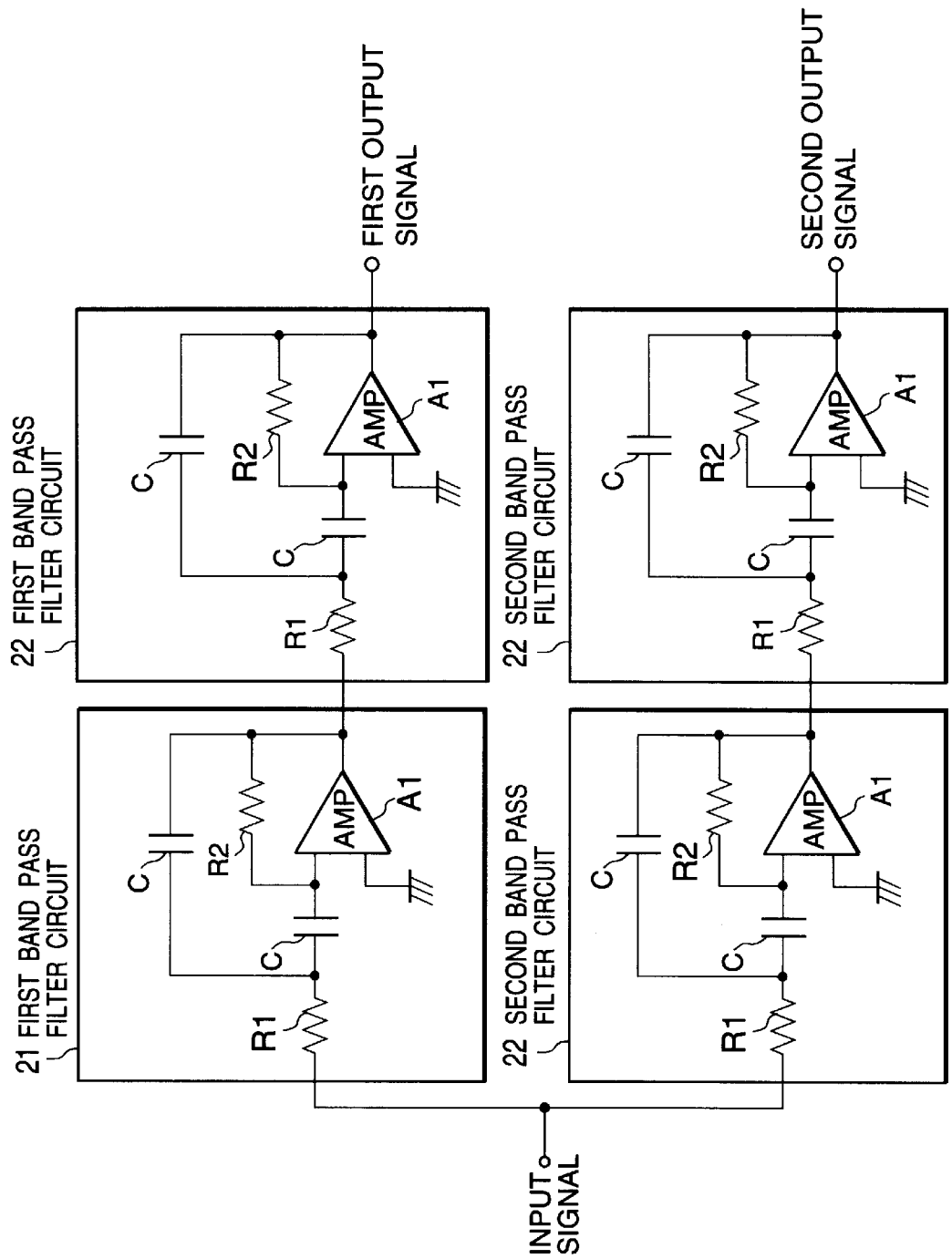
FIG. 6 is a schematic diagram showing another example of the structure of the signal distribution phase shifter shown in FIG. 1.

In addition, as shown in FIG. 6, since the first band pass filter circuits 21 and the second band pass filter circuits 22 are tandem-connected, the fluctuation of the amplitude at around 100 MHz decreases and the accuracy of the signal distribution phase shifter 7 further improves.

Figure 9A:
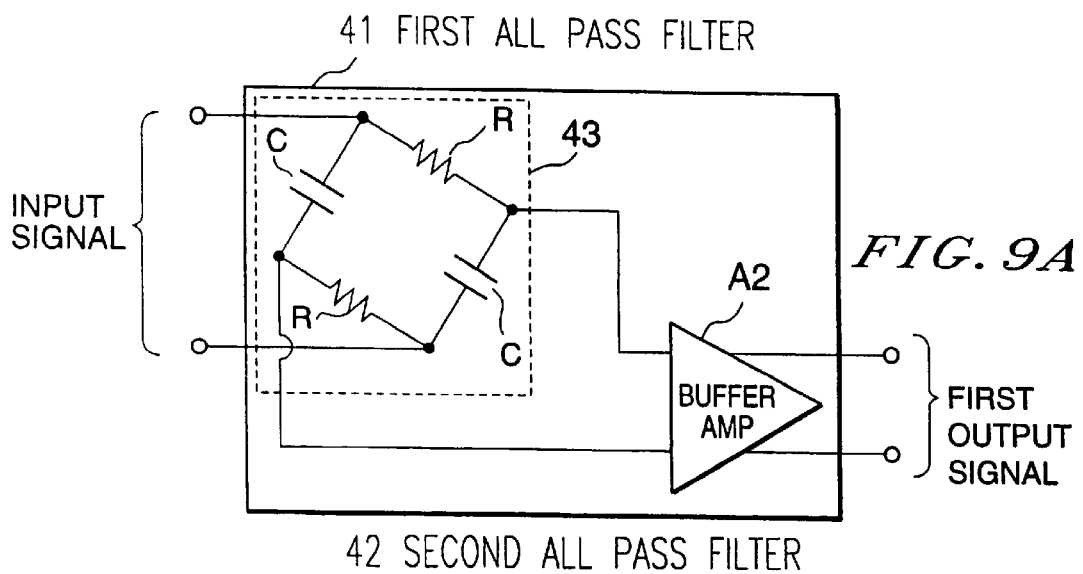
FIG. 9 is a schematic diagram showing the structure of a signal distribution phase shifter according to a second embodiment of the present invention.
Figure 9B:
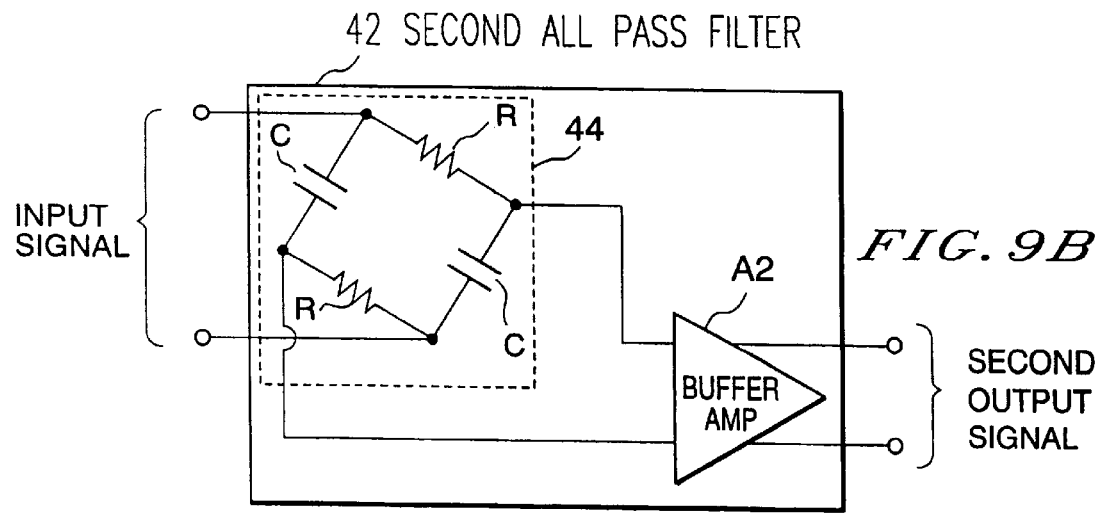
Figure 10:
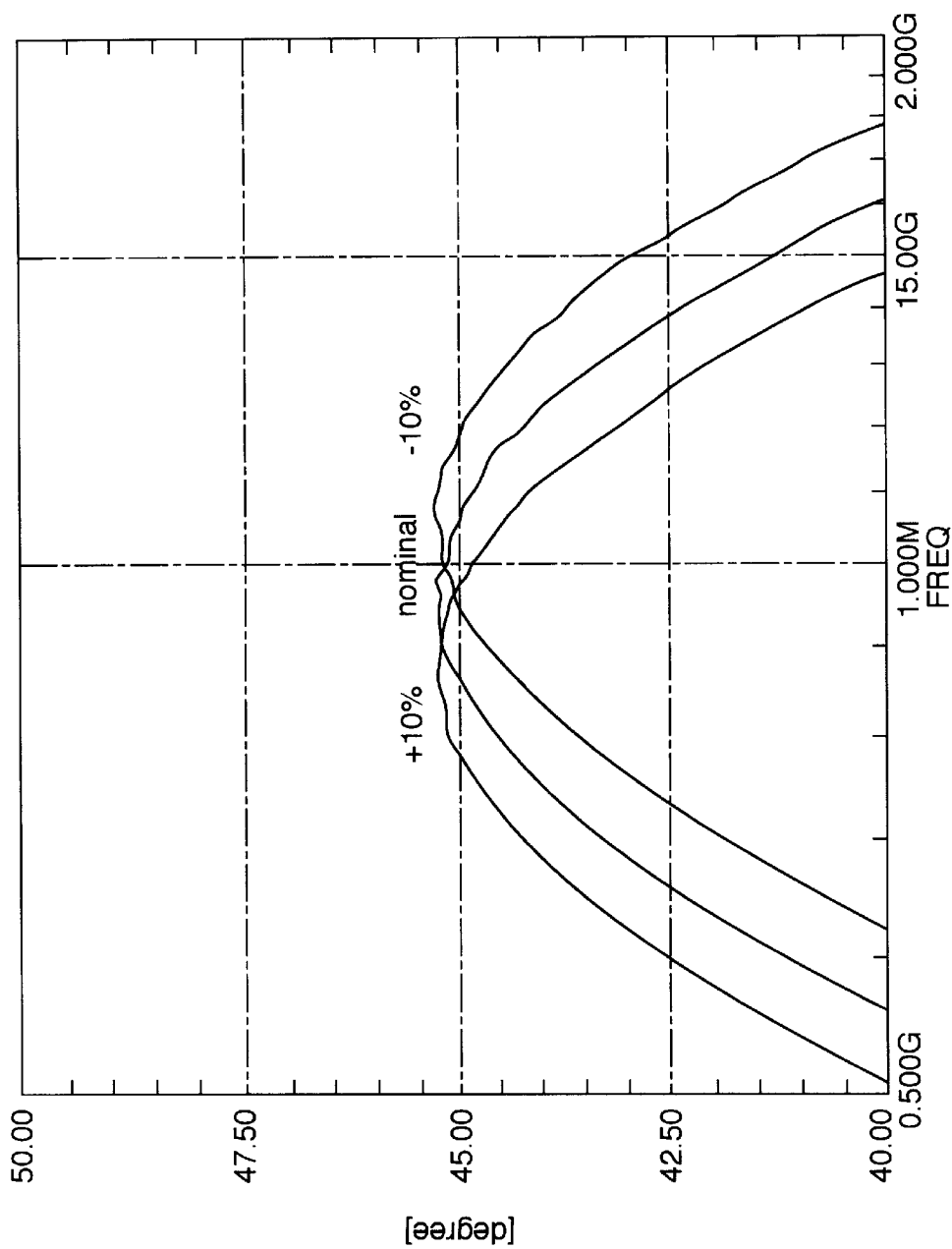
FIG. 10 is a graph showing frequency-phase difference characteristics of the signal distribution phase shifter shown in FIG. 9.
Figure 11:
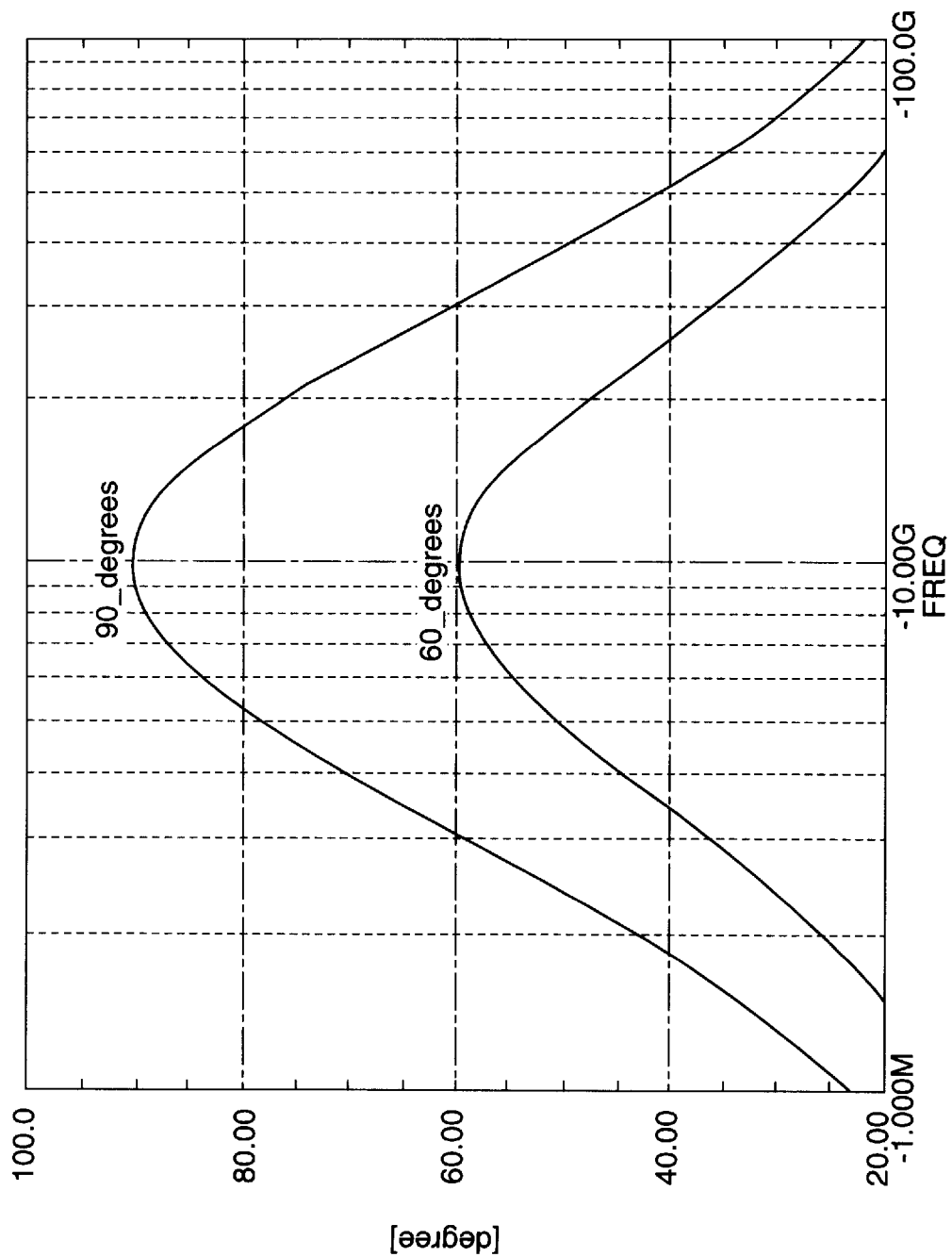
FIG. 11 is a graph showing frequency-phase difference characteristics of the signal distribution phase shifter shown in FIG. 9.

Next, with reference to FIGS. 9 to 11, a signal distribution phase shifter according to a second embodiment of the present invention will be described. FIG. 9 is a schematic diagram showing the structure of the signal distribution phase shifter according to the second embodiment of the present invention. FIGS. 10 and 11 show frequency-phase difference characteristics of the signal distribution phase shifter according to the second embodiment.

As shown in FIG. 9, the signal distribution phase shifter is composed of a first all pass filter circuit 41 and a second all pass filter circuit 42. The first full band pass filter circuit 41 comprises an RC bridge circuit 43 and a buffer amplifying circuit A2. The RC bridge circuit 43 causes a signal path to vary corresponding to the frequency of the input signal. The buffer amplifying circuit A2 buffers and stores the signal received from the RC bridge circuit 43. The second all pass filter 42 comprises an RC bridge circuit 44 and a buffer amplifier A2. The RC bridge circuit 44 has the same element structure as the RC bridge circuit 43 and different element values therefrom. The buffer amplifying circuit A2 buffers and amplifies the signal received from the RC bridge circuit 44.

In the case of the signal distribution phase shifter, since the first all pass filter circuit 41 and the second all pass filter circuit 42 have full band pass characteristics that allow all frequency components of the input signals to pass, the amplitudes of the output signals do not depend on the frequencies. Thus, the amplitude of the output signal of the all pass filter circuit 41 is almost the same as the amplitude of the output signal of the all pass filter circuit 42. However, when a large signal current is obtained from each of the RC bridge circuits 43 and 44, since errors of the amplitudes and phases thereof become large, the buffer amplifier A2 is used.

In the signal distribution phase shifter according to the first embodiment (namely, the band pass filter circuits 21 and 22 shown in FIG. 2), operational amplifying circuits A1 are required. In this case, the signal distribution phase shifter cannot be used in a radio frequency environment. However, in the second embodiment, since the buffer amplifier circuits A2 that are used in a radio frequency environment are disposed, it can be said that the signal distribution phase shifter according to the second embodiment is suitable in the radio frequency environment.

FIG. 10 shows frequency-phase difference characteristics in the case that the capacitance of a signal distribution phase shifter that outputs signals with a phase difference of 45° at around 1 GHz is increased by 10% and decreased by 10% as designed values. From FIG. 10, it is clear that the phase difference of the signal distribution phase shifter at 1 GHz is in 45°±1°.

FIG. 11 shows frequency-phase difference characteristics in the case that the phase differences of output signals to an input signal of the signal distribution phase shifter are 60° and 90°. From FIG. 11, it is clear that good results for these phase differences are obtained. Table 1 shows elements values (constants) of the first all pass filter circuit 41 and second all pass filter circuit 42.

TABLE 1

| Phase difference | First all pass filter circuit | | Second all pass filter circuit | |
|---|---|---|---|---|
| | Resistance | Capacitance | Resistance | Capacitance |
| 45° | 168 Ω | 1.5 pF | 112 Ω | 1.0 pF |
| 60° | 190 Ω | 1.5 pF | 100 Ω | 950 fF |
| 90° | 250 Ω | 1.6 pF | 100 Ω | 680 fF |

The (element values) contents of the elements are all designed values.

In the signal distribution phase shifter according to the second embodiment, since the first all pass filter circuit 41 composed of the RC bridge circuit 43 and the buffer amplifier A2 and the second all pass filter circuit 42 composed of the RC bridge circuit 44 and the buffer circuit A2 are disposed on an IC chip, a high performance signal distribution phase shifter with a phase difference of 45°±1° at a frequency of 1 GHz can be accomplished. In addition, since the buffer amplifying circuits A2 are used instead of the operational amplifying circuits A1, a signal distribution phase shifter suitable in a radio frequency environment can be accomplished.

Figure 13:
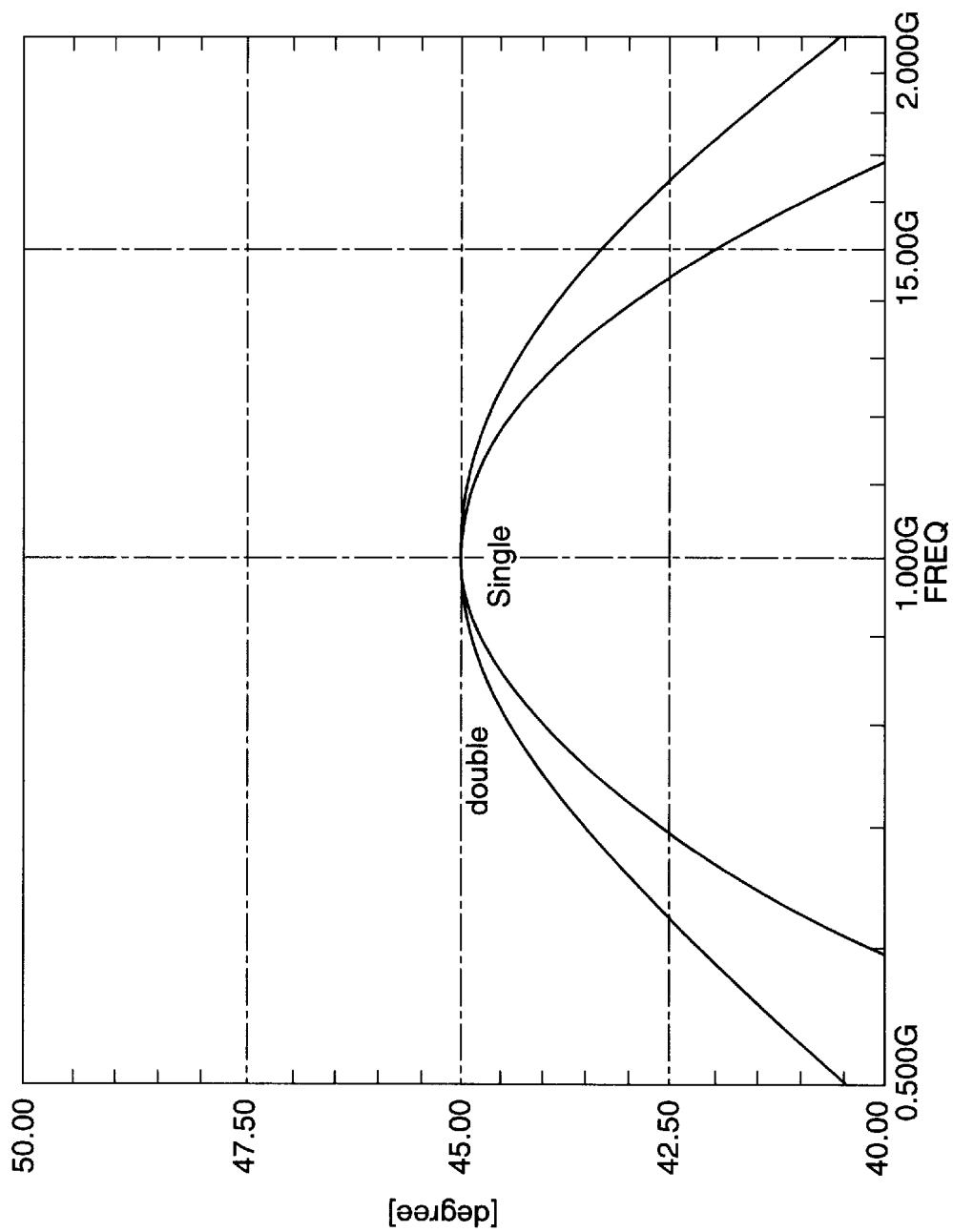
FIG. 13 is a graph showing frequency-phase difference characteristics of the signal distribution phase shifter shown in FIG. 12.
Figure 14:
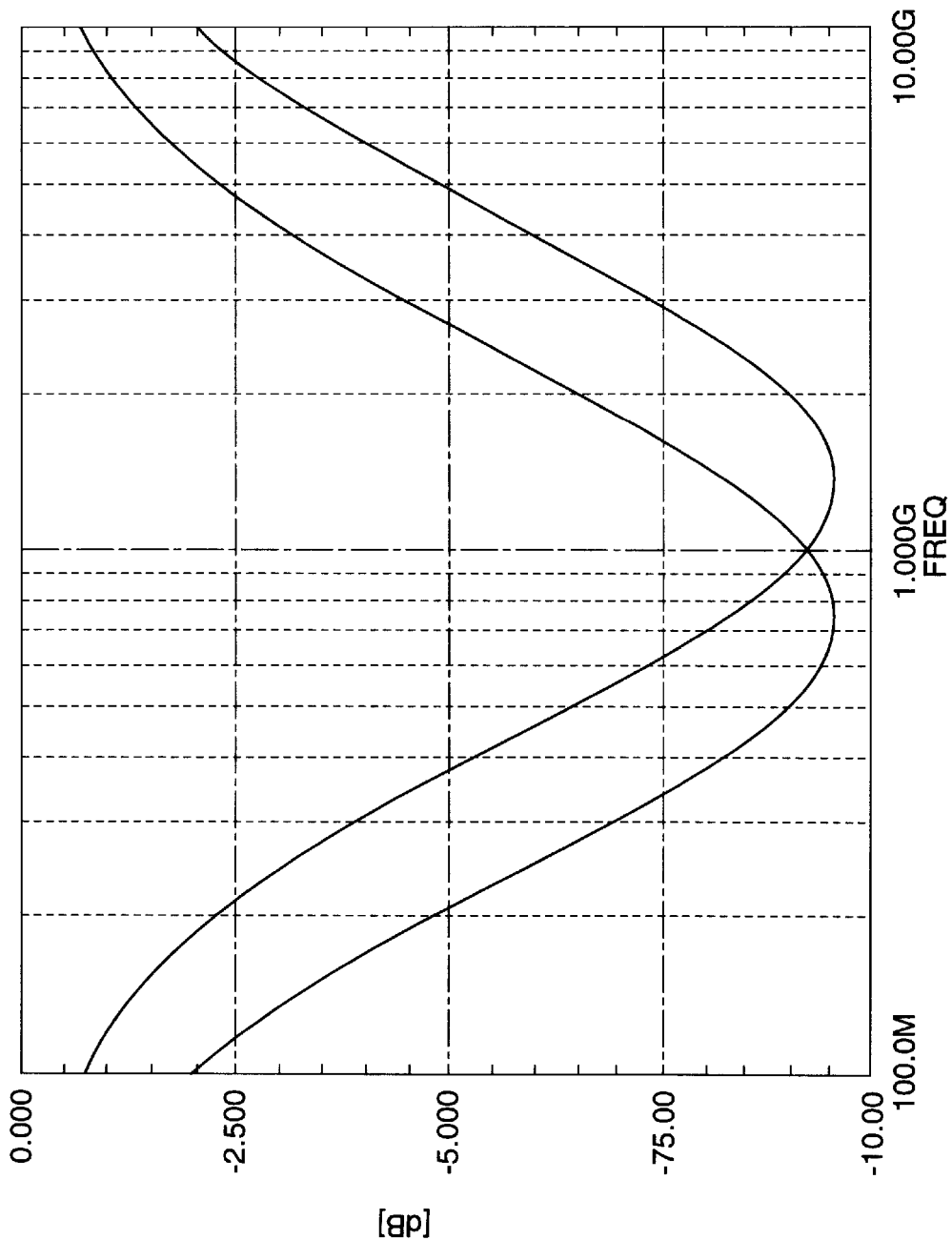
FIG. 14 is a graph showing frequency-amplitude characteristics of the signal distribution phase shifter shown in FIG. 12.

Next, with reference to FIGS. 12 to 14, a signal distribution phase shifter according to a third embodiment of the present invention will be described. FIG. 12 is a schematic diagram showing the structure of the signal distribution phase shifter according to the third embodiment. FIGS. 13 and 14 are schematic diagrams showing frequency-phase difference characteristics and frequency-amplitude characteristics of the signal distribution phase shifter according to the third embodiment.

As shown in FIG. 12, the signal distribution phase shifter according to the third embodiment comprises a first band elimination filter circuit 51 and a second full band path filter circuit 52. The first full band pass filter circuit 51 comprises two RC bridge circuits 43 that are tandem-connected (connected in series) and a buffer amplifying circuit A2. The second band elimination filter circuit 52 comprises two RC bridge circuits 44 that are tandem-connected (connected in series) and a buffer amplifying circuit A2.

FIG. 13 shows frequency-phase difference characteristics of the signal distribution phase shifter composed of the first band elimination filter circuit 51 and the second band elimination filter circuit 52.

When the frequency-phase difference characteristics shown in FIG. 13 are compared with those in the case that one RC bridge circuit 43 and one RC bridge circuit 44 are used (the frequency-phase difference characteristics shown in FIG. 10), the curves in FIG. 13 are smoother than the curves in FIG. 10. Thus, with the RC bridge circuits 43 and 44 that are tandem-connected for a plurality number of stages, the influence of errors of the element values is further suppressed. As shown in FIG. 14, the frequency-amplitude characteristics in FIG. 14 represent band eliminating characteristics that do not lesser vary than those of the single-staged RC bridge circuit. However, the amplitudes of these structures at the center frequency are the same.

Thus, in the signal distribution phase shifter according to the third embodiment, since the first band elimination filter circuit 51 and the second band elimination filter circuit 52 of which RC bridge circuits 43 and 44 are tandem-connected for two stages each are disposed on an IC chip, the influence of errors of circuit elements is lesser suppressed than that of the second embodiment. Thus, the frequency-phase difference characteristics of two output signals of the signal distribution phase shifter are further improved.

Figure 15:
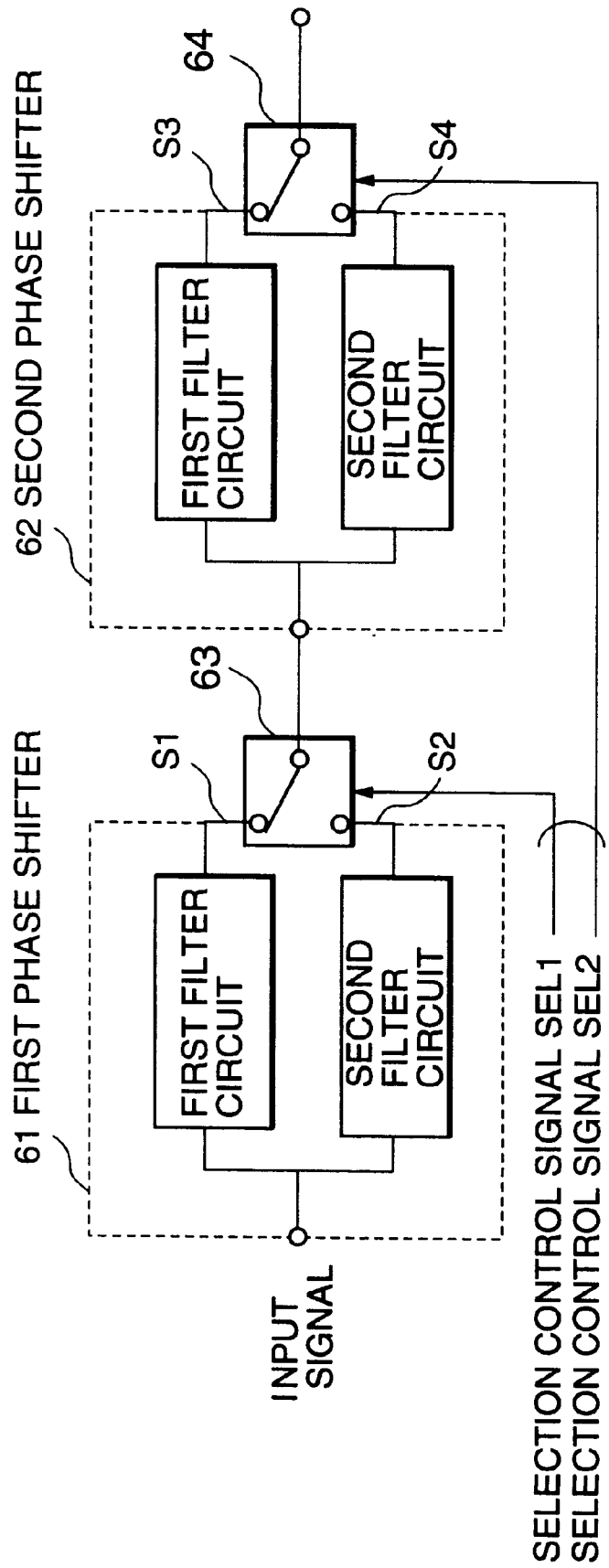
FIG. 15 is a schematic diagram showing the structure of a signal distribution phase shifter of signal selecting type according to a fourth embodiment of the present invention.

Next, with reference to FIG. 15, a signal distribution phase shifter according to a fourth embodiment of the present invention will be described. FIG. 15 shows the structure of the signal distribution phase shifter that comprises a first signal distribution phase shifter and a second signal distribution phase shifter connected in series and that outputs different signals with a phase difference of two bits.

Referring to FIG. 15, the signal distribution phase shifter comprises a first phase shifter 61, a second phase shifter 62, a signal selecting means 63, and a signal selecting means 64. The first phase shifter 61 generates a first output signal S1 and a second output signal S2. The second phase shifter 62 generates a third output signal S3 and a fourth output signal S4. The signal selecting means 63 selects one of the first output signal S1 and the second output signal S2 corresponding to a selection control signal SEL1. The signal selecting means 64 selects one of the third output signal S3 and the fourth output signal S4 corresponding to a selection control signal SEL2. The signal selecting means 63 and 64 are composed of for example semiconductor switches.

In other words, in the signal distribution phase shifter, the signal distribution phase shifters according to the first to third embodiments are connected in series for two stages. Output signals of the distribution phase shifters are switched.

In this case, one of the first output signal S1 and the second output signal S2 generated by the first phase shifter 61 is selected by the signal selecting means 63 and used as an input signal of the second phase shifter 62.

One of the third output signal S3 and the fourth output signal S4 generated by the second phase shifter 62 is selected by the signal selecting means 64 and output as an output signal with a phase difference to the input signal. Thus, two signals with a phase difference of two bits are obtained.

According to the signal distribution phase shifter according to the fourth embodiment, the signal selecting means 63 is disposed between the first phase shifter 61 and the second phase shifter 62. The selection control signal is supplied to the signal selecting means so as to switch the output signal. Thus, a signal with a phase difference of 45° and 60° as well as 90° to the input signal can be output.

Thus, a general-purpose high-performance signal distribution phase shifter can be accomplished on an integrated circuit.

In the first to fourth embodiments, band pass filter circuits and band elimination filter circuits were described. However, the present invention may be applied to a band elimination filter circuit that attenuates a particular band of an input signal. In addition, according to the present invention, the frequency characteristics of a filter circuit that shifts the phase are not limited. In this case, although the structure of a plurality of elements that compose each filter circuit is the same, the element values are different.

As described above, according to the present invention, since the first filter circuit and the second filter circuit whose structures are the same and whose element values are different are disposed on an integrated circuit, the influence of fabrication errors of the circuit elements is suppressed. Thus, the frequency characteristics of the first output signal and the second output signal are improved.

In addition, with such an element structure, the phase difference of an input signal to an output signal can be varied. Thus, a general-purpose phase shifter can be accomplished.

Thus, a genera-purpose high-performance phase shifter can be accomplished.

Moreover, a phase shifter with a high absolute accuracy can be structured.

Furthermore, when the phase shifter according to the present invention is applied to a radio frequency stage of a receiving unit, the size thereof can be reduced and the performance thereof can be improved.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A phase shifter for switching phase of an output signal, comprising:

a first all pass filter which is composed of a plurality of first elements formed on an IC chip and outputs a first output signal by shifting a phase of said input signal;

a second all pass filter which is composed of a plurality of second elements which is simultaneously formed with said plurality of first elements on said IC chip, has the same circuit structure as said first all pass filter and outputs a second output signal having a different phase from the first output signal by shifting a phase of said input signal; and a signal selecting means for outputting one output signal selected from said first output signal outputted from said first all pass filter and said second output signal outputted from said second all pass filter;

wherein said first all pass filter and said second all pass filter each comprising:

a bridge circuit composing a plurality of resistors and a plurality of capacitors; and an output buffer amplifier connected to a back stage of said bridge circuit.

* * * * *

UNITED STATES PATENT AND TRADEMARK OFFICE
CERTIFICATE OF CORRECTION

PATENT NO. : 6,057,723
DATED : May 2, 2000
INVENTOR(S) : Takafumi Yamaji et al.

It is certified that error appears in the above-identified patent and that said Letters Patent is hereby corrected as shown below:

Column 1,
Line 35, change "sifter output" to -- shifter outputs --;

Column 3,
Line 3, change "a" to -- an -- in the first occurrence;
Line 15, after "accuracy" insert -- can be accomplished --;

Column 4,
Line 37, change "10converts" to -- 10 converts --;

Column 5,
Line 59, change "2 0and" to -- 20 and --;

Column 6,
Line 52, change "44" to -- 44 --;

Column 7,
Line 16, after "first" insert -- all --;

Column 8,
Line 38, change "full band pass" to -- band elimination --;

Column 10,
Line 16, change "genera-purpose" to -- general purpose --.

Signed and Sealed this

Ninth Day of October, 2001

*Attest:*

NICHOLAS P. GODICI
*Attesting Officer*    *Acting Director of the United States Patent and Trademark Office*